US008264004B2

(12) United States Patent
Jin et al.

(10) Patent No.: US 8,264,004 B2
(45) Date of Patent: Sep. 11, 2012

(54) MECHANISM FOR FORMING A REMOTE DELTA DOPING LAYER OF A QUANTUM WELL STRUCTURE

(75) Inventors: Been-Yih Jin, Lake Oswego, OR (US); Jack T. Kavalieros, Portland, OR (US); Suman Datta, Beaverton, OR (US); Amlan Majumdar, White Plains, NY (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/715,034

(22) Filed: Mar. 1, 2010

(65) Prior Publication Data
US 2010/0219396 A1    Sep. 2, 2010

Related U.S. Application Data

(62) Division of application No. 11/731,266, filed on Mar. 29, 2007, now Pat. No. 7,713,803.

(51) Int. Cl.
*H01L 29/778* (2006.01)
(52) U.S. Cl. .......... 257/194; 257/191; 257/E29.11; 257/E29.251; 257/E29.254
(58) Field of Classification Search .......... 257/191, 257/194, E29.11, E29.251, E29.254
See application file for complete search history.

(56) References Cited

U.S. PATENT DOCUMENTS

| 5,488,237 | A | 1/1996 | Kuwata |
| 6,350,993 | B1 | 2/2002 | Chu et al. |
| 6,770,902 | B2 * | 8/2004 | Phillips .......... 257/20 |
| 6,803,596 | B2 * | 10/2004 | Hata .......... 257/13 |
| 7,851,780 | B2 * | 12/2010 | Hudait et al. .......... 257/14 |
| 2002/0125475 | A1 | 9/2002 | Chu et al. |
| 2004/0094811 | A1 | 5/2004 | Takagi |
| 2004/0161006 | A1 | 8/2004 | Chang |
| 2005/0173728 | A1 * | 8/2005 | Saxler .......... 257/192 |
| 2006/0148182 | A1 * | 7/2006 | Datta et al. .......... 438/289 |
| 2006/0255364 | A1 * | 11/2006 | Saxler et al. .......... 257/192 |
| 2006/0284165 | A1 * | 12/2006 | Berger et al. .......... 257/25 |
| 2007/0054460 | A1 | 3/2007 | Enicks |
| 2008/0116485 | A1 * | 5/2008 | Hudait et al. .......... 257/192 |
| 2008/0142786 | A1 * | 6/2008 | Datta et al. .......... 257/24 |
| 2008/0157058 | A1 * | 7/2008 | Hudait et al. .......... 257/14 |
| 2008/0203381 | A1 * | 8/2008 | Hudait et al. .......... 257/14 |
| 2008/0210927 | A1 * | 9/2008 | Hudait et al. .......... 257/14 |
| 2008/0227246 | A1 * | 9/2008 | Chiu et al. .......... 438/172 |

(Continued)

FOREIGN PATENT DOCUMENTS
CN        1289149 A      3/2001

OTHER PUBLICATIONS

H. Rucker et al., Appl. Phys. Lett (USA), vol. 73, pp. 1682-1684, 1998.

(Continued)

*Primary Examiner* — David Vu
*Assistant Examiner* — Earl Taylor
(74) *Attorney, Agent, or Firm* — Blakely, Sokoloff, Taylor & Zafman LLP

(57) ABSTRACT

A method of fabricating a quantum well device includes forming a diffusion barrier on sides of a delta layer of a quantum well to confine dopants to the quantum well.

15 Claims, 6 Drawing Sheets

U.S. PATENT DOCUMENTS

2008/0237572 A1* 10/2008 Chui et al. .................. 257/14
2008/0296556 A1* 12/2008 De Souza et al. ............ 257/15
2009/0127542 A1* 5/2009 Sugaya et al. ............... 257/24

OTHER PUBLICATIONS

H.J. Osten et al., Appl. Phys. Lett (USA), vol. 71, pp. 1522-1524, 1997.

Chien et al., Device Linear Improvement Using SiGe/Si Heterostructure Delta-Doped-Channel Field-Effect Transistors, Jpn. J. Appl. Phys., col. 39, (2000) pp. L1149-L1151.

Jin et al., SiGe Diffusion Barriers for P-doped Si-SiGe Resonant Interband Tunnerl Diodes, IEEE, 2002, pp. 265-269.

Ducroquet et al., Double SiGe:C diffusion barrier channel 40nm CMOS with improved short-channel peformances, IEEE, 2004, pp. 17.5.1-17.5.4.

"PCT Search Report and Written Opinion", PCT/US2008/058446, (Aug. 18, 2008), 10 pgs.

Hu Hui-Yong et al., "Hole-sheet-density in Si Ge pMOS quantum well with S-doping-layer", ACTA PHYSICA SINICA, Chin. Phys. Soc., vol. 53, No. 12, Dec. 2004, http://www.cnki.net, 5 pgs.

Jin, N., "Diffusion Barrier Cladding in Si/SiGe Resonant Interband Tunneling Diodes and Their Patterned Growth on PMOS Source/Drain Regions", *IEEE Transactions on Electron Devices*, vol. 50(9), (2003), 1876-1884.

Madhavi, S., et al., "High Room-Temperature Hold Mobility in Ge0.7Si0.3/Ge/Ge0.7Si0.3 Modulation-Doped Heterostructures", *Journal Appl. Phys.*, vol. 89(4), (2001), 2497-2499.

Osten, H.J., et al., "Wider Latitude for Sophisticated Devices by Incorporating Carbon onto Crystalline Si or SiGe.", *Microelectronic Engineering*, vol. 56, (2001), 209-212.

* cited by examiner

- 50A Si barrier stops P diffusion from Ge, both as dep and after 600C, 1' activation anneal (P in Ge).

- 50A SiGe(69%) barrier is shown ineffective in stopping the P diffusion into the undoped Ge region after 600C, 1' anneal.

US 8,264,004 B2

MECHANISM FOR FORMING A REMOTE DELTA DOPING LAYER OF A QUANTUM WELL STRUCTURE

The present application is a divisional of U.S. patent application Ser. No. 11/731,266, filed on Mar. 29, 2007 now U.S. Pat. No. 7,713,803, entitled "Mechanism for Forming a Remote Delta Doping Layer of a Quantum Well Structure". U.S. patent application Ser. No. 11/731,266 is incorporated herein by reference.

FIELD OF THE INVENTION

Embodiments of the present invention relate to semiconductor integrated circuits, and more particularly to field effect transistors, and methods for fabricating the transistors.

BACKGROUND

Quantum wells are formed in semiconductor devices such as diode lasers, High Electron Mobility Transistors (HEMTs) used in low-noise electronics and infrared photodetectors used for infrared imaging. Particularly, a quantum well is a potential well that confines particles, which were originally free to move in three dimensions, to two dimensions, forcing them to occupy a planar region. The effects of quantum confinement take place when the quantum well thickness becomes comparable at the de Broglie wavelength of the carriers (generally electrons and holes); leading to energy levels called "energy subbands", i.e., the carriers can only have discrete energy values.

Quantum wells are formed in semiconductors by having a material, like gallium arsenide sandwiched between two layers of a material with a wider bandgap, like aluminum arsenide. These structures can be grown by molecular beam epitaxy or chemical vapor deposition with control of the layer thickness down to monolayers.

In order to achieve high mobility quantum well device structures, a key element is the ability to confine dopants in close proximity h intrinsic quantum well. Such a requirement is not easily met in many cases due to the uncontrolled diffusivity of such dopants. The dopants in a delta doped layer can diffuse or "spill into" the quantum well during the subsequent growth and annealing steps and hence degrade the device mobility/performance.

A partial solution to the problem of dopant out-diffusion from the delta doped layer during subsequent dopant activation annealing steps is the use of ultra fast ramping RTA (rapid thermal annealing). This does not address dopant diffusion/spread entirely though since dopants can also diffuse during the remainder of the growth process for the surrounding high energy gap material. Furthermore many other subsequent processes such as metallization, spacer formation, etc. may not be compatible with the ultra low thermal budget requirements for maintaining the delta doped layer.

BRIEF DESCRIPTION OF THE DRAWINGS

The invention is illustrated by way of example and not limitation in the figures of the accompanying drawings, in which like references indicate similar elements, and in which.

DETAILED DESCRIPTION

A mechanism for forming a doped quantum well structure is described. In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

As Complementary Metal-Oxide Semiconductor (CMOS) devices continue to scale down the gate length, one device parameter that is severely impacted by the continual increase of dopants in the channel is the carrier mobility. Thus, remotely doped quantum well structures are increasingly being implemented. The advantages of using remotely doped quantum well structures rather than conventional surface channel devices include higher mobility due to reduced surface roughness and impurity scattering (e.g., dopant not present in the quantum well) in the channel, and incorporation of strain in quantum well and with strain stabilization from bottom and cap hetero-epitaxial (Epi) layers. However, as discussed above, dopant out diffusion is a main concern of controlling the high concentration of dopants in the delta doped layer.

According to one embodiment, a quantum well structure is fabricated by forming of a diffusion barrier material on either side of a delta doping layer in order to confine the dopants in close proximity to a quantum well. In such an embodiment, a hetero-epitaxial quantum well structure is grown with a high mobility, narrow band gap, channel layer that is sandwiched between two wider bandgap layers. The electronic band structure at the hetero-junction interface confines either electron or hole carriers using conduction band offset or valence band offset, respectively.

During the growth of the wide band gap layers, heavily doped delta doping layers are grown sufficiently close to the quantum well layer as a carrier reservoir. Prior and after growth of the heavily doped delta layer, thin dopant diffusion barrier layers are grown above and below the heavily doped delta doping layer. The dopant diffusion barrier is formed, in one embodiment, by introducing a layer which has low dopant diffusivity (such as Si in a Ge quantum well structure), or by adding impurity in the wide band gap layers to suppress dopant diffusion (e.g. by adding carbon (C) in Si or SiGe to effectively suppress Boron (B) and Phosphorus (P) diffusion)

Figure 1:
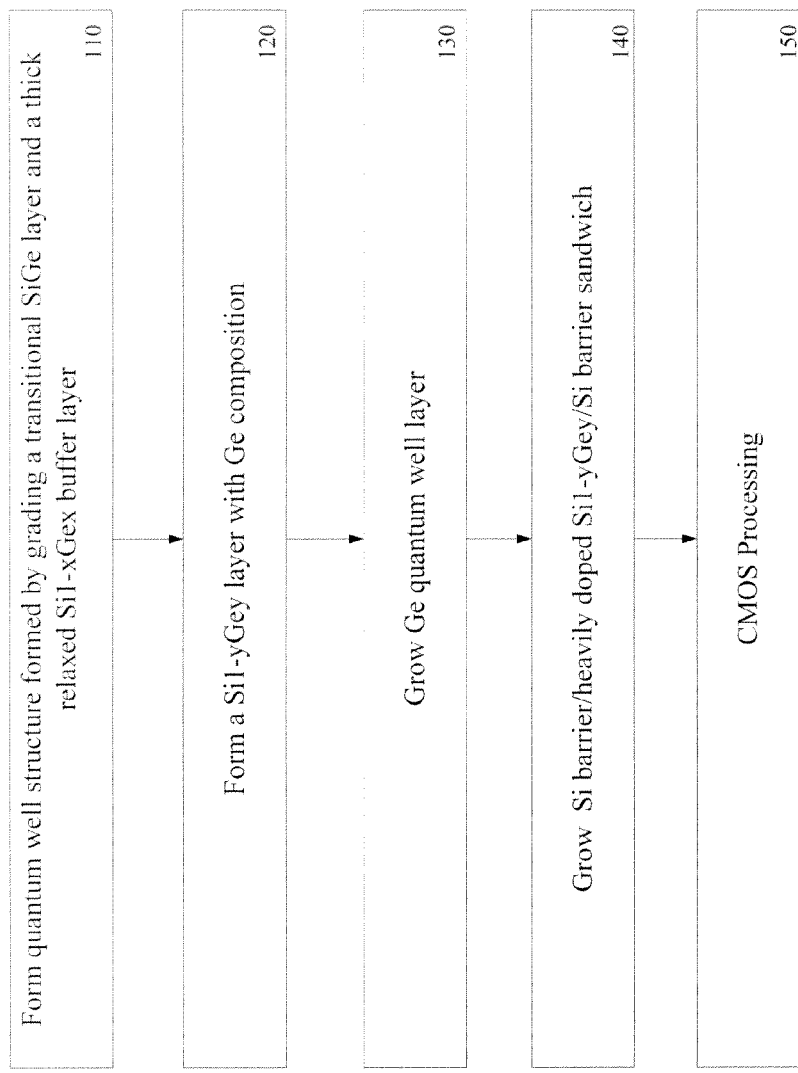
FIG. 1 illustrates one embodiment of a method of fabricating a quantum well device.
Figure 2:
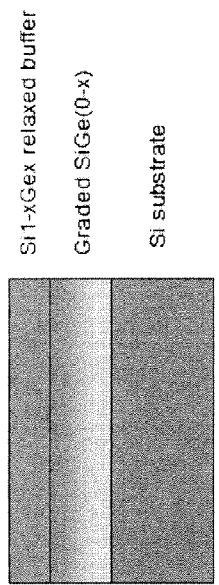
FIGS. 2-6 illustrate one embodiment of various stages in the fabrication of a quantum well device.

FIG. 1 illustrates one embodiment of fabrication processes of one embodiment of a Ge quantum well and a sharp boundary delta doping layer. At processing block 110, a quantum well structure is formed by grading a transitional SiGe layer and a thick relaxed film Epi layer (e.g., Si1-xGex) to reduce dislocation defect of the Ge quantum well layer. FIG. 2 illustrates one embodiment of the graded SiGe and Si1-xGex layers formed on the Si substrate.

Figure 3:
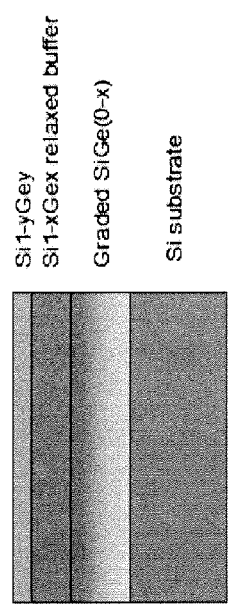

Referring back to FIG. 1, a Si1-yGey layer is formed with the Ge composition tailored to have a desired valence band offset with the Ge quantum well valence band, processing block 120. FIG. 3 illustrates one embodiment of the Si1-yGey layer is formed over the Si1-xGex layer.

Figure 4:
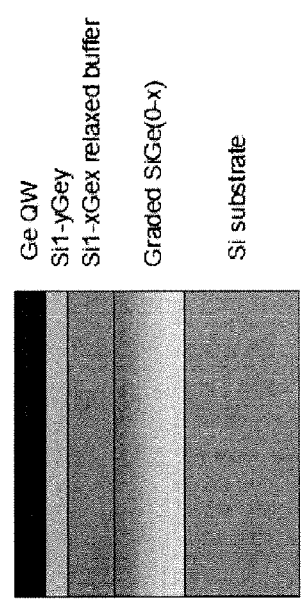
Figure 5:
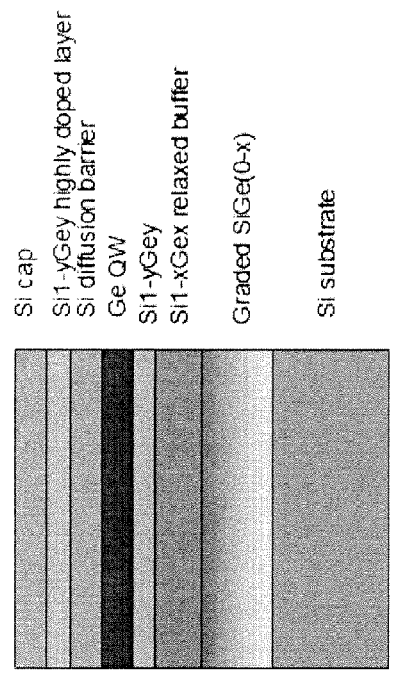
Figure 6:
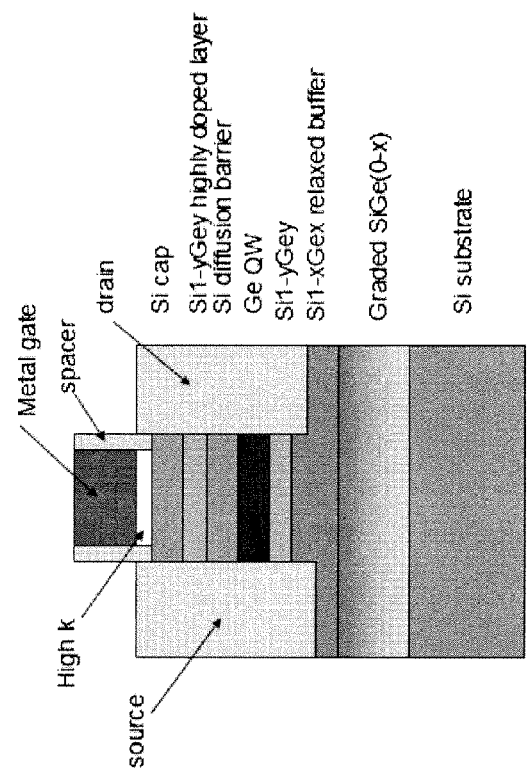

Referring back to FIG. 1, the Ge quantum well layer is grown over the Si1-yGey layer, processing block 130. FIG. 4 illustrates one embodiment of the formed Ge quantum well layer. Referring back to FIG. 1, a Si barrier/heavily doped Si1-yGey/Si barrier sandwich is grown to contain the delta dopants, processing block 150. FIG. 5 illustrates one embodiment of the Si barrier/heavily doped Si1-yGey/Si barrier formed over the Ge quantum well layer.

Referring back to FIG. 1, industry standard CMOS processing is then carried out to fabricate the remainder of the Ge QW PMOS device on the above substrate, processing block 150. Such processing includes. FIG. 5 illustrates one embodiment of a quantum well device having a diffusion layer surrounded delta doping area. In other embodiments, the diffusion barrier/delta doping layer stack can also be placed under the quantum well.

Figure 7A:
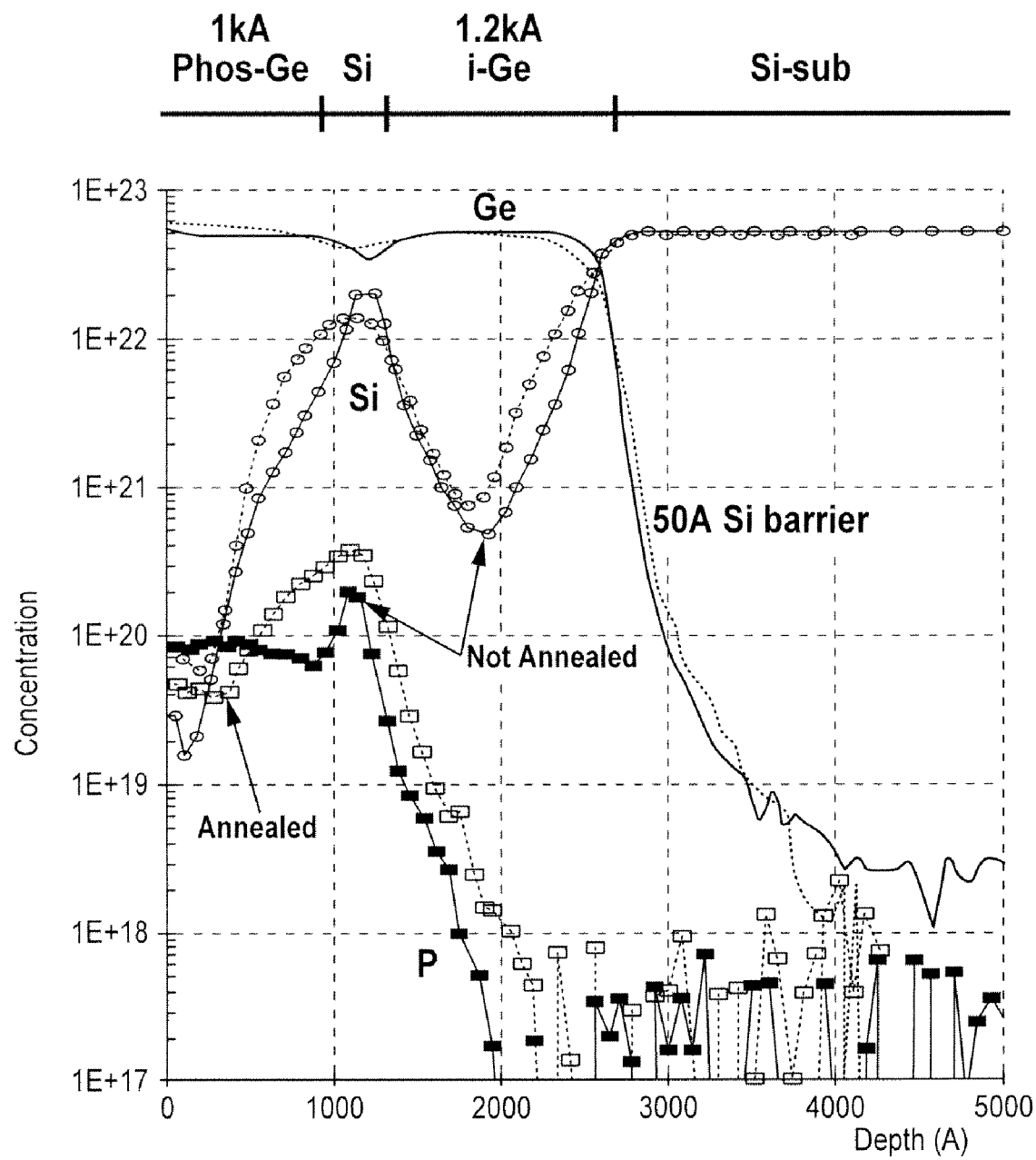
FIGS. 7A and 7B are graphs illustrating dopant diffusion.
Figure 7B:
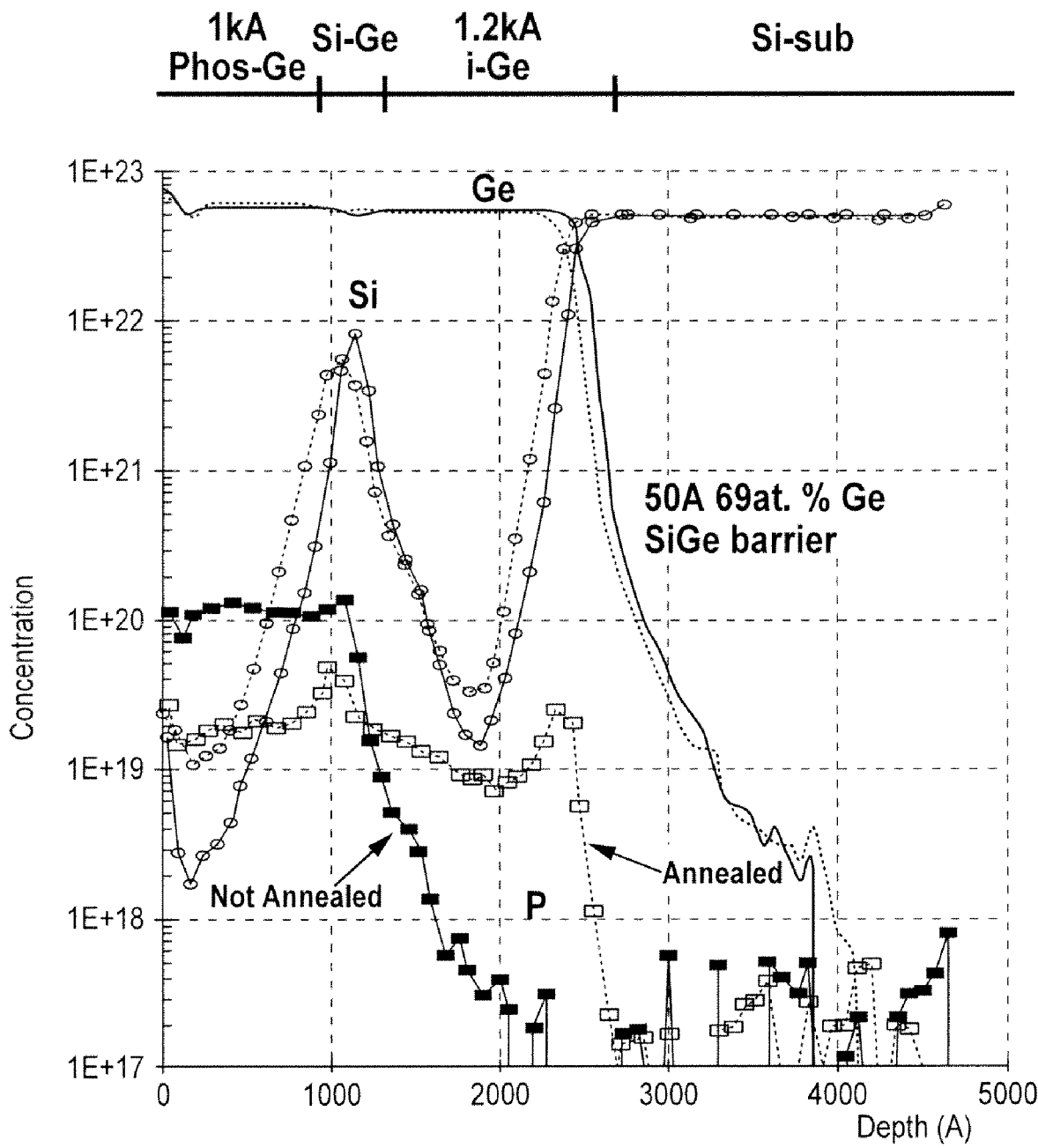

FIGS. 7A and 7B illustrate examples of dopant diffusion barrier layers on blanket wafers for the case of high mobility Germanium (Ge) quantum well layers. The figures show mass spectrometry (SIMS) profile of Phosphorus in a Ge Epi layer grown on a silicon (Si) substrate. A thin 50 A Si or a 50 A 69% SiGe layer is embedded in Ge as a dopant diffusion layer. Comparing the 50 A Si barrier in FIG. 7A and the 50 A 69% SiGe barrier of FIG. 7B, the 50 A Si effectively blocked the P diffusion in the top n-Ge from diffusing into the undoped i-Ge bottom layer.

Although described above with respect to a GE quantum well structure and, the above-described method may be implemented in other embodiments using any kind of high mobility quantum well structure. In further embodiments, any kind of diffusion barrier may be implemented; including a C doped Si or SiGe.

Figure 8:
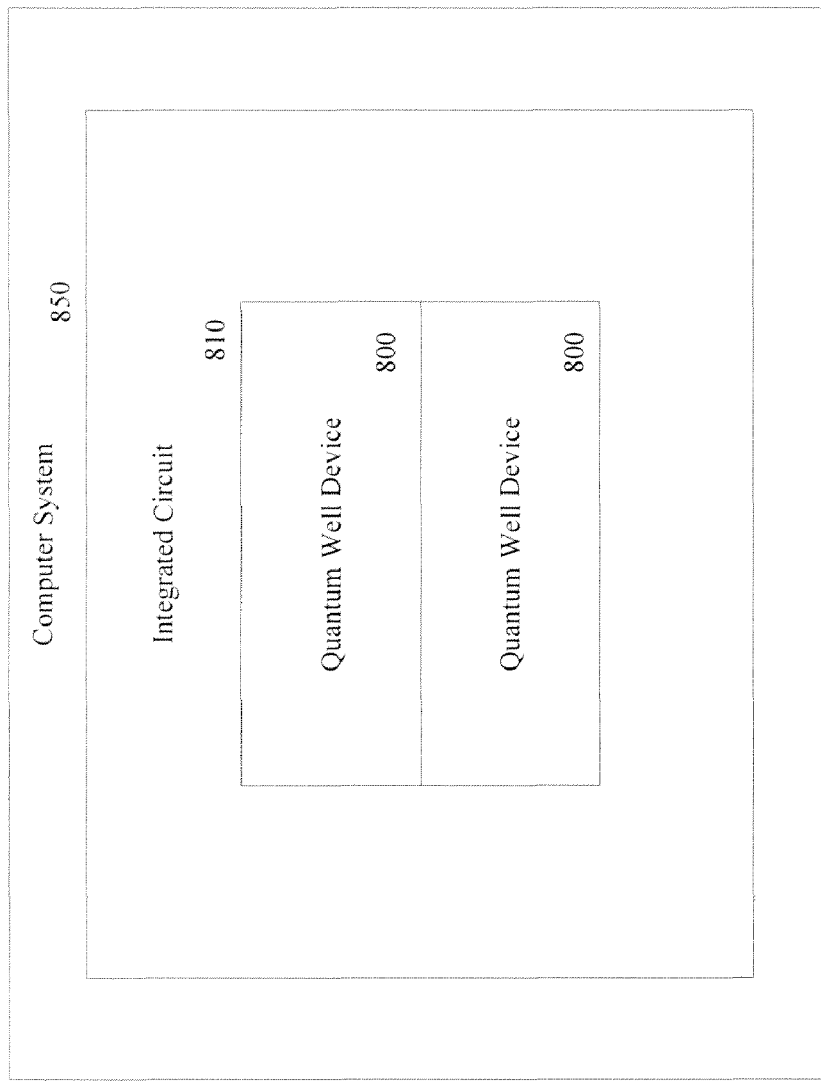
FIG. 8 illustrates that quantum well devices, according to various embodiments of the invention, may be used in an integrated circuit and incorporated into a computer system.

FIG. 8 illustrates that quantum well devices 800, according to various embodiments of the invention, may be used in an integrated circuit 810 (or another chip, monolith device, semiconductor device, or microelectronic device, as they are generally understood in the field) and incorporated into a computer system 850 (or other electrical system). The computer system, which may be a portable, laptop, desktop, server, mainframe, or other computer system, may also include other conventional computer system components, such as a bus to communicate data, a memory to store data (e.g., main memory, read only memory, and/or a mass storage device), a display device to display data, a data entry device e.g., a keyboard, a cursor control device), and a communication device to link to other electrical systems.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as essential to the invention.

What is claimed is:

1. A device comprising:
   a quantum well structure having:
   a quantum well layer;
   a delta doped layer operable to serve as a carrier reservoir;
   a first dopant diffusion barrier below the delta doped layer; and
   a second dopant diffusion barrier above the delta doped layer;
   a substrate;
   a graded transitional layer over the substrate; and
   a relaxed film epitaxial layer over the graded transitional layer and under the quantum well structure.

2. The device of claim 1 wherein the transitional layer and the relaxed film epitaxial layer are to reduce a dislocation defect of the quantum well layer.

3. The device of claim 1 further comprising a first $Si_{1-y}Ge_y$ layer over the relaxed film epitaxial layer and below the quantum well layer.

4. The device of claim 1 wherein an electronic band structure at a hetero-junction interface of the quantum well layer confines electron carriers using conduction band offset.

5. The device of claim 1 wherein an electronic band structure at a hetero-junction interface of the quantum well layer confines hole carriers using valence band offset.

6. A device comprising:
   a quantum well structure including:
   a first wider bandgap layer;
   a second wider bandgap layer;
   a narrower bandgap layer sandwiched between the first and second wider bandgap layers,
   wherein at least one of the first and second wider bandgap layers is doped and operable to serve as a carrier reservoir, and
   wherein electronic band structures between the narrower bandgap layer and the first and second wider bandgap lavers are operable to confine carriers;
   a dopant diffusion barrier layer disposed between the first and second wider bandgap layers;
   a substrate;
   a graded transitional layer over the substrate; and
   a thick buffer layer operable to reduce dislocation defect of the narrower bandgap layer over the graded transitional layer, the thick buffer layer under the quantum well structure.

7. The device of claim 6, wherein the dopant diffusion barrier layer comprises a silicon layer.

8. The device of claim 6, wherein the dopant diffusion barrier layer comprises carbon.

9. The device of 6, wherein the dopant diffusion barrier layer has a thickness of about 50 A.

10. The device of claim 6, wherein the first wider bandgap layer comprises a first $Si_{1-y}Ge_y$ layer, wherein the narrower bandgap layer comprises a Ge layer, wherein the second wider bandgap layer comprises a second $Si_{1-y}Ge_y$ layer, and wherein the dopant diffusion barrier layer comprises an Si diffusion barrier.

11. The device of claim 6, wherein the narrower bandgap layer is a channel of a transistor having a metal gate.

12. A device comprising:
    a substrate;
    a quantum well structure over the substrate, the quantum well structure including:
    a first wider bandgap layer;
    a narrower bandgap layer over the first wider bandgap layer; and
    a second wider bandgap layer over the narrower bandgap layer, wherein electronic band structures between the narrower bandgap layer and the first and second wider bandgap layers are operable to confine carriers, and wherein at least one of the first and second wider bandgap layers is doped and operable to serve as a carrier reservoir; and
a dopant diffusion barrier layer between the narrower bandgap layer and said one of the first and second wider bandgap layers;
a high-k dielectric layer over the second wider bandgap layer;
a metal gate over the high-k dielectric layer; and
a source and a drain, wherein the quantum well structure is between the source and the drain;
a graded transitional layer over the substrate; and
a thick buffer layer operable to reduce dislocation defect of the narrower bandgap layer over the graded transitional layer, the thick buffer layer under the quantum well structure.

13. The device of claim 12, wherein the dopant diffusion barrier layer comprises a silicon layer.

14. The device of claim 12, wherein the dopant diffusion barrier layer comprises carbon.

15. The device of claim 12, wherein the first wider bandgap layer comprises a first $Si_{1-y}Ge_y$ layer, wherein the narrower bandgap layer comprises a Ge layer, wherein the second wider bandgap layer comprises a second $Si_{1-y}Ge_y$ layer, and wherein the dopant diffusion barrier layer is operable to suppress diffusion of dopant from said one of the first and second wider bandgap layers.

* * * * *